United States Patent
Tesch

(10) Patent No.: US 11,221,638 B2
(45) Date of Patent: Jan. 11, 2022

(54) OFFSET CORRECTED BANDGAP REFERENCE AND TEMPERATURE SENSOR

(71) Applicant: Qorvo US, Inc., Greensboro, NC (US)

(72) Inventor: Bruce John Tesch, Melbourne, FL (US)

(73) Assignee: Qorvo US, Inc., Greensboro, NC (US)

( * ) Notice: Subject to any disclaimer, the term of this patent is extended or adjusted under 35 U.S.C. 154(b) by 394 days.

(21) Appl. No.: 16/288,226

(22) Filed: Feb. 28, 2019

(65) Prior Publication Data
US 2020/0278708 A1    Sep. 3, 2020

(51) Int. Cl.
| | | |
|---|---|---|
| *H01L 35/00* | (2006.01) | |
| *G05F 1/575* | (2006.01) | |
| *G01K 7/21* | (2006.01) | |
| *H03F 3/45* | (2006.01) | |
| *H03M 1/12* | (2006.01) | |

(52) U.S. Cl.
CPC ............ *G05F 1/575* (2013.01); *G01K 7/21* (2013.01); *H03F 3/45* (2013.01); *H03M 1/12* (2013.01)

(58) Field of Classification Search
CPC .......... G01K 7/01; G01K 3/005; G01K 7/015; G05F 3/30; G05F 3/267; G05F 3/262; G05F 3/205; H01L 23/34; G11C 5/147
USPC ........................... 327/512–513, 539
See application file for complete search history.

(56) References Cited

U.S. PATENT DOCUMENTS

| | | | | |
|---|---|---|---|---|
| 6,242,974 B1 * | 6/2001 | Kunst | ..................... | G01K 7/01 327/554 |
| 2008/0061865 A1 * | 3/2008 | Koerner | ................... | G05F 3/30 327/512 |
| 2009/0201067 A1 * | 8/2009 | Haneda | ..................... | G05F 3/30 327/306 |
| 2013/0328615 A1 * | 12/2013 | Sano | ......................... | G05F 3/30 327/513 |
| 2017/0257113 A1 * | 9/2017 | Singh | ....................... | G01K 7/34 |
| 2019/0131863 A1 * | 5/2019 | El Markhi | ............ | H02M 3/156 |

(Continued)

OTHER PUBLICATIONS

Chen, Jianguang, et al., "A high-accuracy temperature sensor with an inaccuracy of ±1° C. From -55° C. to 125° C.," International Conference on Solid-State and Integrated Circuit Technology, Nov. 2010, IEEE, 3 pages.

(Continued)

*Primary Examiner* — Quan Tra
(74) *Attorney, Agent, or Firm* — Withrow & Terranova, P.L.L.C.

(57) ABSTRACT

An offset corrected bandgap reference and temperature sensor is disclosed. In a complementary metal-oxide-semiconductor (CMOS) bandgap reference, non-idealities in the operational amplifier (op-amp) bandgap reference circuit can lead to a voltage offset. This operational amplifier offset voltage is the dominant source of error in the bandgap reference. If the bandgap reference is used in a temperature sensor, it only needs to be accurate during the analog-to-digital conversion cycle. Embodiments of the present disclosure employ switched capacitors to store the operational amplifier offset during a sample mode in which the bandgap reference operates continuous-time. The operational amplifier offset is then corrected during a hold mode while the temperature sensor completes the analog-to-digital conversion.

20 Claims, 14 Drawing Sheets

(56) References Cited

U.S. PATENT DOCUMENTS

2020/0249096 A1* 8/2020 Tao .................. G05F 3/222
2020/0333196 A1* 10/2020 Zanbaghi ............ G01K 7/34

OTHER PUBLICATIONS

Pertijs, Michiel, et al., "A CMOS Smart Temperature Sensor With a 3σ inaccuracy of ±0.5° C. from -50° C. to 120° C.," IEEE Journal of Solid-State Circuits, vol. 40, Issue 2, Feb. 2005, pp. 454-461.
Shalmany, Saleh, et al., "A Micropower Battery Current Sensor with ±0.03% (3σ) inaccuracy from -40 to +85° C.," International Solid-State Circuits Conference, Digest of Technical Papers, 2013, IEEE, pp. 386-388.
Souri, Kamran, et al., "A CMOS Temperature Sensor With a Voltage-Calibrated Innacuracy of ±0.15° C. (3σ) from -55 to 125° C.," IEEE Journal of Solid-State Circuits, vol. 48, Issue 1, Jan. 2013, pp. 292-301.
Tuthill, Mike, "A Switched Current, Switched Capacitor Temperature Sensor in 0.6u CMOS," IEEE Journal of Solid-State Circuits, vol. 33, Issue 7, Jul. 1998, pp. 1117-1122.

* cited by examiner

OFFSET CORRECTED BANDGAP REFERENCE AND TEMPERATURE SENSOR

FIELD OF THE DISCLOSURE

This application relates to semiconductor temperature sensors.

BACKGROUND

Performance of electronic devices can depend on thermal characteristics. A temperature sensor can provide instantaneous or near-instantaneous average temperatures or other thermal information for various components of an electronic device. Increasingly, such temperature sensors are required to operate with high accuracy using lower on-chip voltages.

Bandgap temperature sensors are commonly used in electronic devices and can be manufactured directly on-chip. Bandgap temperature sensors can sense temperature using the temperature-dependent forward voltage of a pn-junction (e.g., a diode or a base-emitter junction of a transistor). Bandgap temperature sensors can also generate a voltage which is proportional to absolute temperature (PTAT) by comparing the voltages of two pn-junctions at the same temperature, but at two different current densities.

SUMMARY

This disclosure relates to an offset corrected bandgap reference and temperature sensor. In a complementary metal-oxide-semiconductor (CMOS) bandgap reference, non-idealities in the operational amplifier (op-amp) bandgap reference circuit can lead to a voltage offset. This operational amplifier offset voltage is the dominant source of error in the bandgap reference. If the bandgap reference is used in a temperature sensor, it only needs to be accurate during the analog-to-digital conversion cycle. Embodiments of the present disclosure employ switched capacitors to store the operational amplifier offset during a sample mode in which the bandgap reference operates continuous-time. The operational amplifier offset is then corrected during a hold mode while the temperature sensor completes the analog-to-digital conversion.

An exemplary aspect relates to an offset-corrected temperature sensor. The offset-corrected temperature sensor includes an analog-to-digital converter (ADC) configured to output a digital temperature signal from a proportional to absolute temperature voltage and a bandgap reference voltage. The offset-corrected temperature sensor also includes a bandgap reference circuit. The bandgap reference circuit includes an output transistor coupled between a reference voltage and the bandgap reference voltage, a first operational amplifier having an output coupled to a gate of the output transistor, and a first capacitor coupled to a first input of the first operational amplifier. During a hold mode the first capacitor corrects the bandgap reference voltage for an offset of the first operational amplifier.

Another exemplary aspect relates to a method for correcting voltage offset in a temperature sensor. The method includes providing a proportional to absolute temperature voltage and providing a bandgap reference voltage using an operational amplifier. The method also includes converting the proportional to absolute temperature voltage and the bandgap reference voltage to a digital temperature signal during a hold mode and correcting the bandgap reference voltage for an offset of the operational amplifier during the hold mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
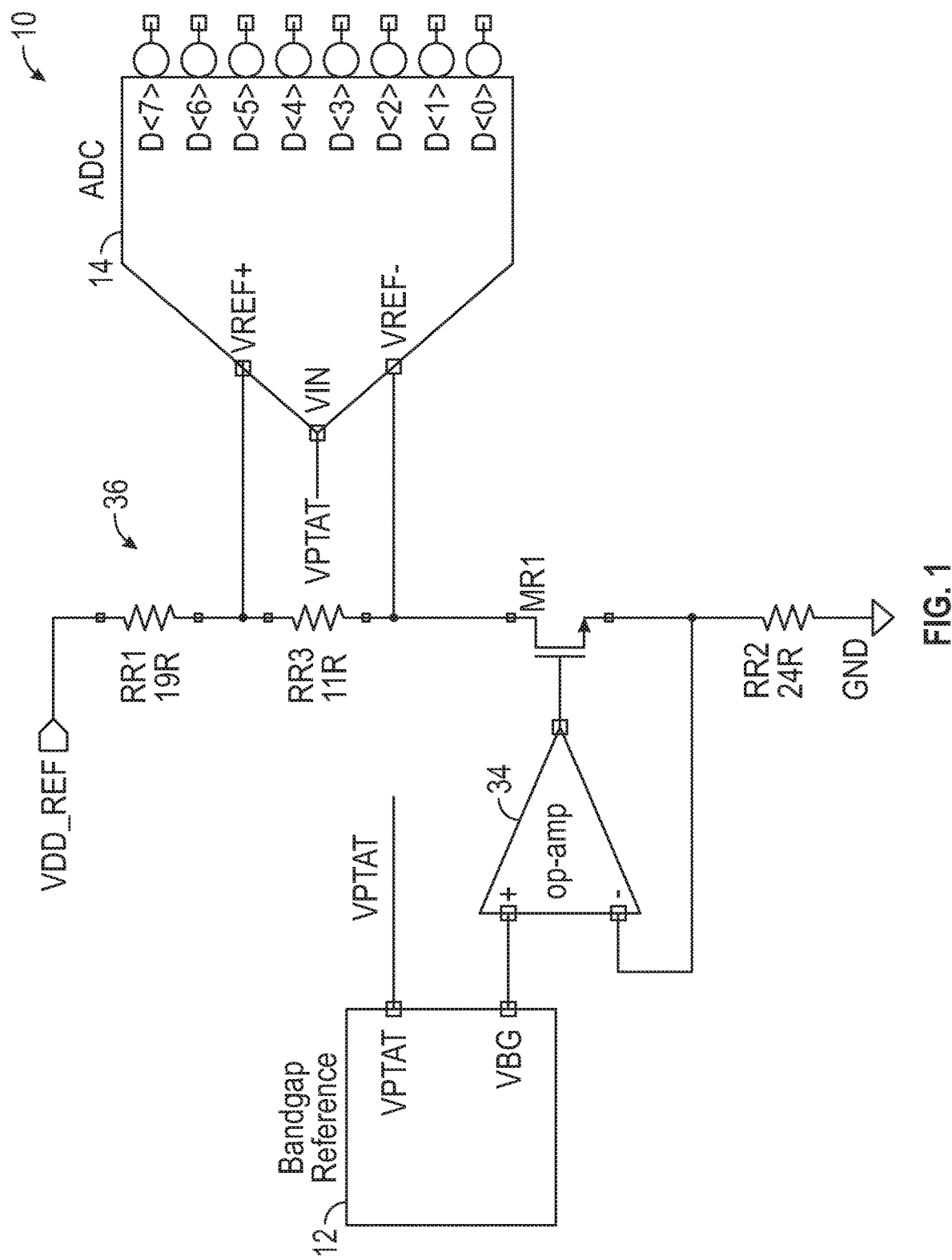
FIG. 1 is a schematic diagram of an exemplary temperature sensor, which includes a bandgap reference circuit and corrects for an operational amplifier voltage offset.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to an offset corrected bandgap reference and temperature sensor. In a complementary metal-oxide-semiconductor (CMOS) bandgap reference, non-idealities in the operational amplifier (op-amp) bandgap reference circuit can lead to a voltage offset. This operational amplifier offset voltage is the dominant source of error in the bandgap reference. If the bandgap reference is used in a temperature sensor, it only needs to be accurate during the analog-to-digital conversion cycle. Embodiments of the present disclosure employ switched capacitors to store the operational amplifier offset during a sample mode in which the bandgap reference operates continuous-time. The operational amplifier offset is then corrected during a hold mode while the temperature sensor completes the analog-to-digital conversion.

FIG. 1 is a schematic diagram of an exemplary temperature sensor 10, which includes a bandgap reference circuit 12 and corrects for an operational amplifier voltage offset. In an exemplary aspect, the temperature sensor 10 includes an analog-to-digital converter (ADC) 14 configured to output a digital temperature signal D<7:0> from a proportional to absolute temperature voltage VPTAT and a bandgap reference voltage VBG. The ADC 14 is depicted as an 8-bit ADC 14, but other examples may include more or fewer output bits, depending on the granularity needed in the digital temperature signal D<7:0>. The ADC 14 is further depicted with inverting outputs, but other embodiments may have non-inverting outputs (see, e.g., FIG. 3) as needed.

In this regard, the positive and negative reference inputs of the ADC 14 are coupled to the bandgap reference voltage VBG and the input of the ADC 14 is coupled to the proportional to absolute temperature voltage VPTAT. The temperature sensor 10 generally operates in two modes—in a sample mode the bandgap reference circuit 12 operates in continuous time and the ADC 14 does not convert the analog input signals to digital (e.g., the digital temperature signal D<7:0> is maintained from a previous conversion). In a hold mode, the bandgap reference circuit 12 holds its outputs (the proportional to absolute temperature voltage VPTAT and the bandgap reference voltage VBG) and the ADC 14 converts these outputs to digital (e.g., the digital temperature signal D<7:0> is updated).

Figure 2A:
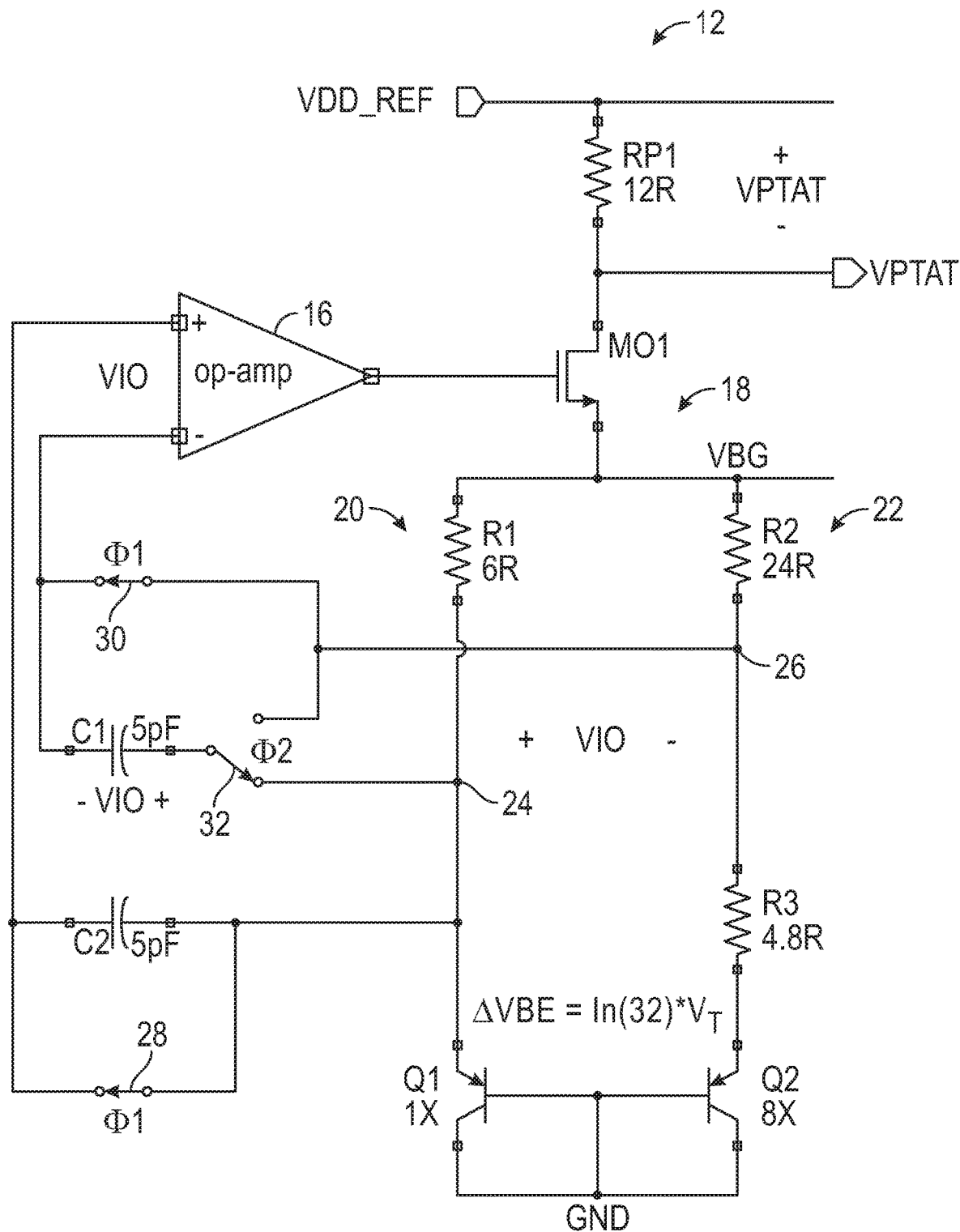
FIG. 2A is a schematic diagram of the bandgap reference circuit of FIG. 1, illustrated in a sample mode.
Figure 2B:
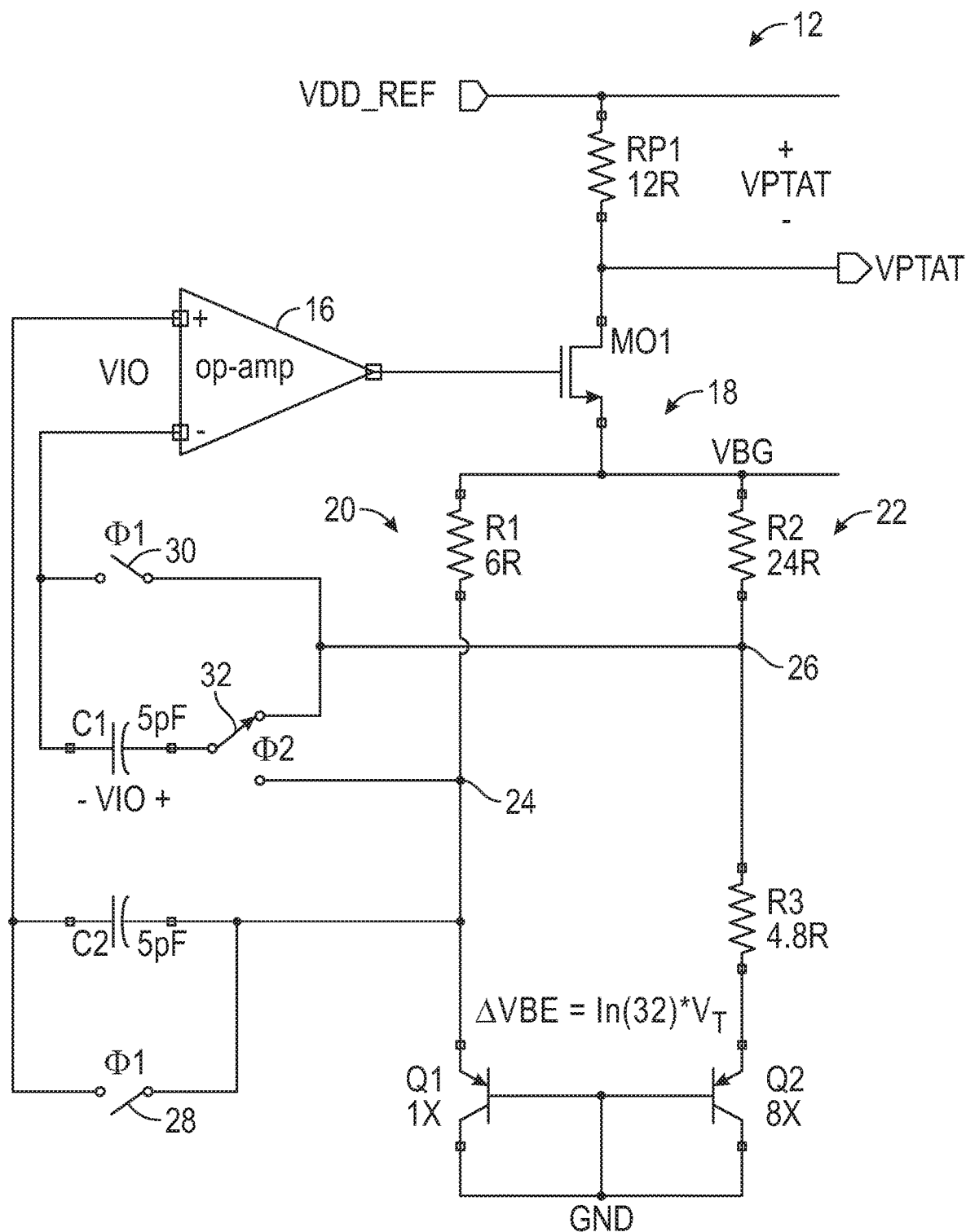
FIG. 2B is a schematic diagram of the bandgap reference circuit of FIG. 1, illustrated in a hold mode.

Turning to FIGS. 2A and 2B, the bandgap reference circuit 12 generates the proportional to absolute temperature voltage VPTAT and the bandgap reference voltage VBG using a first operational amplifier 16 coupled to a voltage divider network 18. FIG. 2A is a schematic diagram of the bandgap reference circuit 12 of FIG. 1, illustrated in a sample mode. FIG. 2B is a schematic diagram of the bandgap reference circuit of FIG. 1, illustrated in a hold mode. The bandgap reference circuit 12 includes an output transistor MO1 coupled between a reference voltage VDD_REF and the bandgap reference voltage VBG. An output of the first operational amplifier 16 is coupled (e.g., directly coupled) to a gate of the output transistor MO1.

The inputs of the first operational amplifier 16 are coupled to the voltage divider network 18. The voltage divider network 18 includes a first branch 20 and a second branch 22. The first branch 20 is coupled between the bandgap reference voltage VBG and a ground voltage GND, and includes a first resistor R1 coupled in series with a first semiconductor junction Q1. The second branch 22 is coupled in parallel with the first branch 20 and includes a second resistor R2, a third resistor R3, and a second semiconductor junction Q2 coupled in series. During the sample mode (illustrated in FIG. 2A), a non-inverting input of the first operational amplifier 16 is coupled to the first branch 20 at a first node 24 between the first resistor R1 and the first semiconductor junction Q1. During the sample mode, an inverting input of the first operational amplifier 16 is coupled to the second branch 22, at a second node 26 between the second resistor R2 and the third resistor R3.

In the bandgap reference circuit 12 of FIGS. 2A and 2B, the first semiconductor junction Q1 and the second semiconductor junction Q2 are PNP bipolar junction transistors (BJTs), but in other examples may be diodes or other transistors. The bandgap reference circuit 12 operates to measure the temperature dependent forward voltage of the first semiconductor junction Q1 and the second semiconductor junction Q2 using a current difference (based on the relative resistances of the first resistor R1 and the second resistor R2) between the first branch 20 and the second branch 22. Additionally, a difference in emitter P-N junction area exists between the first semiconductor junction Q1 and the second semiconductor junction Q2, further increasing a difference in a base-emitter voltage ΔVBE. The first operational amplifier 16 causes the base-emitter voltage ΔVBE to appear across the third resistor R3, thereby producing the proportional to absolute temperature voltage VPTAT and the bandgap reference voltage VBG. However, non-idealities in the first operational amplifier 16 introduce an error (e.g., a voltage offset) in both the bandgap reference voltage VBG and the proportional to absolute temperature voltage VPTAT.

Thus, the bandgap reference circuit 12 further includes a first capacitor C1 coupled to a first input (e.g., the inverting input) of the first operational amplifier 16 which corrects the bandgap reference voltage VBG for the offset of the first operational amplifier 16. During the sample mode illustrated in FIG. 2A, the op-amp offset voltage is sampled on the first capacitor C1. The bandgap reference circuit 12 has a 4:1 current ratio from the first branch 20 to the second branch 22, and an 8:1 emitter ratio from the second semiconductor junction Q2 to the first semiconductor junction Q1. These ratios create a difference in base-emitter voltage ΔVBE of 90 millivolts (mV) at 25° C. for a bandgap reference circuit 12 (and temperature sensor 10) on a silicon substrate. This voltage appears across the third resistor R3 due to the feedback loop (with an ideal first operational amplifier 16 having an offset voltage is 0 volts (V)). Other ratios of current and area could also be used but there are trade-offs as will be recognized by one skilled in the art. In addition, the bandgap reference circuit 12 can be on another semiconductor substrate, with the difference in base-emitter voltage ΔVBE changing according to the substrate.

In an exemplary aspect, a proportional resistor RP1 is coupled between the reference voltage VDD_REF and the output transistor MO1. In some examples, the output transistor MO1 is an N-channel field effect transistor (NFET), and a drain of the output transistor MO1 is coupled (e.g., directly coupled) to the proportional resistor RP1, while a source of the output transistor MO1 is coupled (e.g., directly coupled) to the bandgap reference voltage VBG. A proportional to absolute temperature (PTAT) current flows through the proportional resistor RP1 to create the proportional to absolute temperature voltage VPTAT across the proportional resistor RP1.

As shown in FIG. 2B, when a command is issued to perform an analog-to-digital conversion of the temperature, the bandgap reference circuit 12 is switched from the sample mode to the hold mode. Non-overlapping clocks (e.g., a first clock Φ1 and a second clock Φ2) are used to ensure that no charge is lost from the first capacitor C1 when this switching occurs.

First, the first clock Φ1 goes low, opening a first single pole single throw (SPST) switch 28 and a second SPST switch 30. A second capacitor C2 (coupled between the non-inverting input of the first operational amplifier 16 and the first node 24, bypassed by the first SPST switch 28 during the sample mode of FIG. 2A) ensures that any charge injection from this event will be common-mode, such that it does not contribute additional offset. In an exemplary aspect, the first capacitor C1 has a capacitance of 5 picofarads (pF), but other values may be used with performance and design trade-offs as will be recognized by one skilled in the art. The second capacitor C2 is matched to the first capacitor C1 (e.g., the capacitors may be placed adjacent one another to achieve a 3-sigma mismatch of approximately 0.2% in a typical CMOS process).

Next, the second clock Φ2 goes low, reconnecting the bottom plate of the first capacitor C1 as shown in FIG. 2B (e.g., by switching a first single pole double-throw (SPDT) switch 32). Thus, the second capacitor C2 is no longer bypassed by the first SPST switch 28, and the first capacitor C1 is coupled between the inverting input of the first operational amplifier 16 and the second node 26 (e.g., between the second resistor R2 and the third resistor R3) during the hold mode. In this manner, the offset voltage of the first operational amplifier 16 is cancelled by the charge/voltage previously stored on the first capacitor C1. Leakage in the first SPST switch 28 and the second SPST switch 30 will be common-mode (and therefore not an issue) due to the presence of the second capacitor C2, which is coupled between the non-inverting input of the first operational amplifier 16 and the first node 24 (e.g., between the first resistor R1 and the first semiconductor junction Q1) during the hold mode.

At the end of the analog-to-digital conversion cycle of the temperature sensor 10, the bandgap reference circuit 12 returns to the continuous-time sample mode. For this reason, the bandgap reference voltage VBG can also be used for biasing the entire temperature sensor 10. The very small change in the bandgap reference voltage VBG between the sample mode and the hold mode (to correct for the offset of the first operational amplifier 16 during the analog-to-digital conversion) is generally acceptable for all but the most demanding applications.

An advantage of the bandgap reference circuit 12 of FIGS. 2A and 2B is that the only mismatch contributors are the first semiconductor junction Q1 and second semiconductor junction Q2, as well as the first resistor R1, the second resistor R2, and the third resistor R3 after the offset of the first operational amplifier 16 has been corrected. In most CMOS processes, this mismatch is minimal for P-N junctions and resistors on silicon and other substrates. Another advantage is that the highly accurate current through the proportional resistor RP1 can be directly used as a measure of temperature without a current mirror which would degrade accuracy.

The bandgap reference circuit 12 thus facilitates substantial improvement in the accuracy of the digital temperature signal D<7:0> by correcting the offset during analog-to-digital conversion of the ADC 14 of FIG. 1. Standard deviation of the bandgap reference voltage VBG with offset correction is improved by more than 2× over circuits without the offset correction. For example, without correction, the standard deviation of the bandgap reference voltage VBG in a given CMOS process is simulated to be 4.78 mV, but this is reduced to 2.03 mV (e.g., an improvement of more than 2×) with the bandgap reference circuit 12 and its offset correction.

Figure 2C:
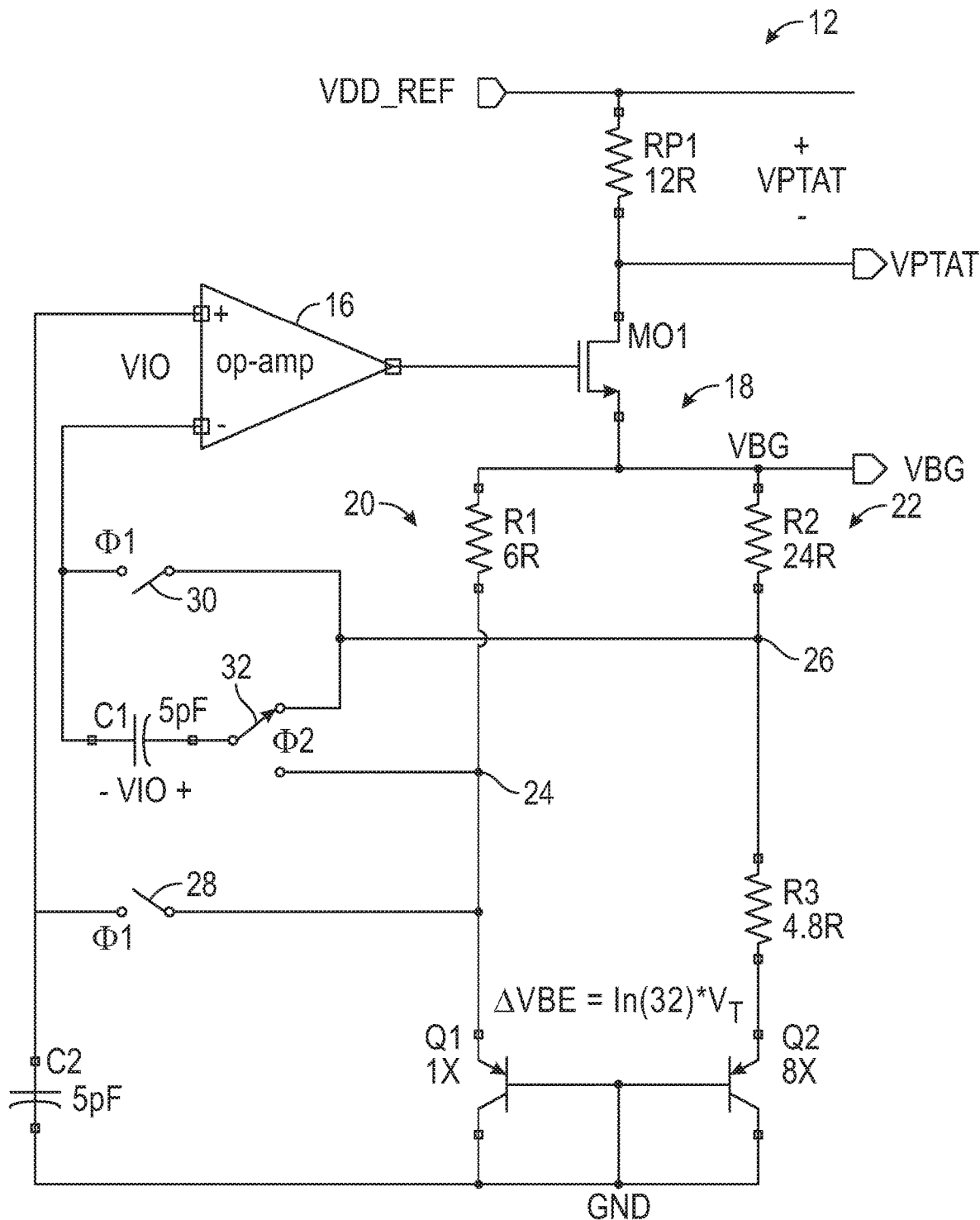
FIG. 2C is a schematic diagram of an alternative embodiment of the bandgap reference circuit of FIG. 1, illustrated in a hold mode.

FIG. 2C is a schematic diagram of an alternative embodiment of the bandgap reference circuit 12 of FIG. 1, illustrated in a hold mode. The bandgap reference circuit 12 of FIG. 2C operates as described above with respect to FIGS. 2A and 2B, but the bottom plate of the second capacitor C2 is connected to the ground voltage GND rather than the first node 24. This has been shown to reduce noise by almost 50% in the hold mode with only a 3.4% increase in error for a given CMOS process.

Returning to FIG. 1, in an exemplary aspect, the proportional to absolute temperature voltage VPTAT is directly coupled to a first input VIN of the ADC 14. The proportional to absolute temperature voltage VPTAT and the ADC 14 reference voltages (VREF+, VREF−) are both referenced to the reference voltage VDD_REF, rather than the ground voltage GND.

To accomplish this, the bandgap reference voltage VBG is referenced to the reference voltage VDD_REF using a second operational amplifier 34 and a reference transistor MR1 coupled to the reference voltage VDD_REF. In this regard, the reference transistor MR1 is coupled between a second input of the ADC 14 and a ground voltage GND. In some examples, the reference transistor MR1 is an NFET and the second input of the ADC 14 is coupled (e.g., directly coupled) to a drain of the reference transistor MR1. A first reference resistor RR1 is also coupled between the drain of the reference transistor MR1 and the reference voltage VDD_REF. A second reference resistor RR2 is coupled between a source of the reference transistor MR1 and the ground voltage GND.

In an exemplary aspect, the second input of the ADC 14 is a differential input, including a positive differential input VREF+ and a negative differential input VREF−. Voltages for the second input are produced through a resistor ladder 36 coupled between the bandgap reference voltage VBG (e.g., through the reference transistor MR1), the positive differential input VREF+, and the negative differential input VREF−. The resistor ladder 36 includes the first reference resistor RR1 and a third reference resistor RR3 coupled in series between the reference voltage VDD_REF and the reference transistor MR1. The positive differential input VREF+ is coupled between the first reference resistor RR1 and the third reference resistor RR3, and the negative differential input VREF− is coupled between the third reference resistor RR3 and the reference transistor MR1.

It should be noted that the second input of the ADC 14 illustrated may not be a fully differential voltage. For example, the positive differential input VREF+ and the negative differential input VREF− may be set at the extremes of the proportional to absolute temperature voltage VPTAT. The ADC 14 provides a digital output proportional to where the proportional to absolute temperature voltage VPTAT lies between the positive differential input VREF+ and the negative differential input VREF− (e.g., the digital temperature signal D<7:0>=0 when VPTAT=VREF−, and =255 when VPTAT=VREF+). In other examples, a fully-differential architecture may be used, as will be appreciated by one skilled in the art.

An output of the second operational amplifier 34 is coupled (e.g., directly coupled) to a gate of the reference transistor MR1. A non-inverting input of the second operational amplifier 34 is coupled to the bandgap reference voltage VBG, and an inverting input of the second operational amplifier 34 is coupled to the source of the reference transistor MR1 (e.g., between the reference transistor MR1 and the second reference resistor RR2). The offset of the second operational amplifier 34 has a minimal impact on the accuracy of the temperature sensor 10.

FIGS. 1-2B (along with the rest of the figures in this disclosure) are illustrated with resistance values relative to a unit resistance R according to an exemplary circuit design. In this regard, the first resistor R1 has resistance 6 R, the second resistor R2 has resistance 24 R, the third resistor R3 has resistance 4.8 R, the proportional resistor RP1 has resistance 12 R, the first reference resistor RR1 has resistance 19 R, the second reference resistor RR2 has resistance 24 R, and the third reference resistor RR3 has resistance 11 R. In some examples, the unit resistance R is equal to 2.5 kilohms (kΩ). It should also be understood that the unit resistance R may vary in other examples. In addition, the relative resistance values may also be varied, resulting in trade-offs of current ranges, voltage ranges, area, and other characteristics of the temperature sensor 10.

In the exemplary temperature sensor 10 of FIG. 1, the reference voltage VDD_REF has a minimum value of about 2.9 V (e.g., the temperature sensor can operate with reference voltage VDD_REF values of about 2.9 V or greater). However, other temperature sensors 10 may be designed to operate with a lower minimum reference voltage VDD_REF. FIGS. 3-9 illustrate alternative temperature sensors 10 designed for this lower reference voltage VDD_REF.

Figure 3:
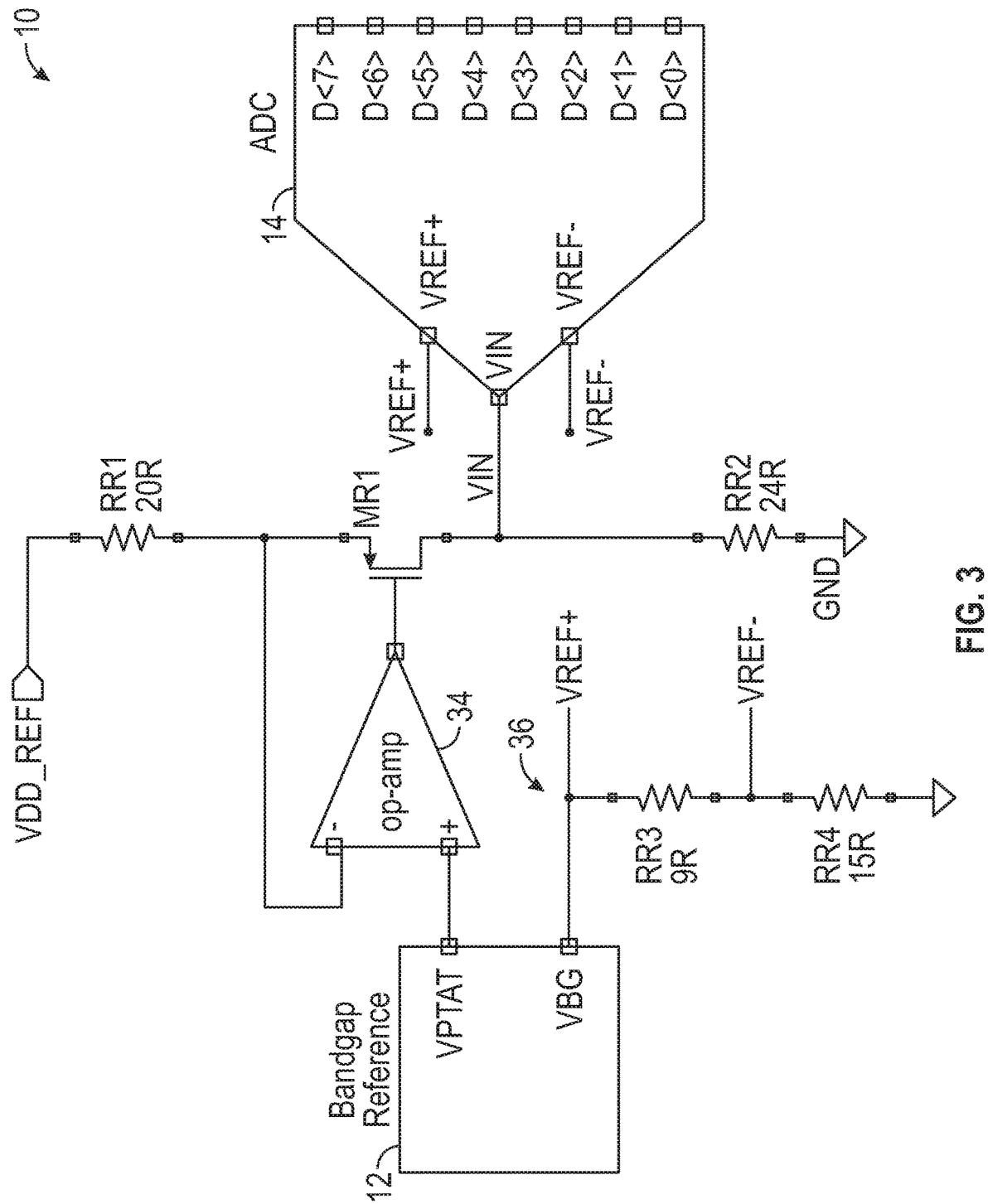
FIG. 3 is a schematic diagram of another exemplary temperature sensor, which includes the bandgap reference circuit of FIGS. 2A, 2B, and 2C.

For example, FIG. 3 is a schematic diagram of another exemplary temperature sensor 10, which includes the bandgap reference circuit 12 of FIGS. 2A, 2B, and 2C. The temperature sensor 10 of FIG. 3 may operate with a minimum reference voltage VDD_REF of about 2.4 V. The temperature sensor 10 in FIG. 3 can flip the proportional to absolute temperature voltage VPTAT voltage reference such that the proportional to absolute temperature voltage VPTAT is no longer referenced to the reference voltage VDD_REF, but rather the inputs to the ADC 14 are both ground referenced.

In the temperature sensor 10 of FIG. 3, the bandgap reference voltage VBG couples directly to the second input of the ADC 14. That is, the resistor ladder 36 is coupled between the bandgap reference voltage VBG and the ground voltage GND. The resistor ladder 36 includes the third reference resistor RR3 (with resistance 9 R) coupled in series with a fourth reference resistor RR4 (with resistance 15 R). The second input of the ADC 14 includes the positive differential input VREF+, coupled directly to the bandgap reference voltage VBG. The second input of the ADC 14 also includes the negative differential input VREF−, coupled between the third reference resistor RR3 and the fourth reference resistor RR4.

The proportional to absolute temperature voltage VPTAT is referenced to the ground voltage GND using the second operational amplifier 34 and the reference transistor MR1 (a P-channel field effect transistor (PFET)) coupled to the ground voltage GND. In this regard, the reference transistor MR1 is coupled between the first input VIN of the ADC 14 and the reference voltage VDD_REF. The first input VIN of the ADC 14 is coupled (e.g., directly coupled) to the drain of the reference transistor MR1. The second reference resistor RR2 (with resistance 24 R) is also coupled between the drain of the reference transistor MR1 and the ground voltage GND. The first reference resistor RR1 (with resistance 20 R) is coupled between the source of the reference transistor MR1 and the reference voltage VDD_REF.

The output of the second operational amplifier 34 is coupled (e.g., directly coupled) to the gate of the reference transistor MR1. The non-inverting input of the second operational amplifier 34 is coupled to the proportional to absolute temperature voltage VPTAT, and the inverting input of the second operational amplifier 34 is coupled to the source of the reference transistor MR1.

Figure 4:
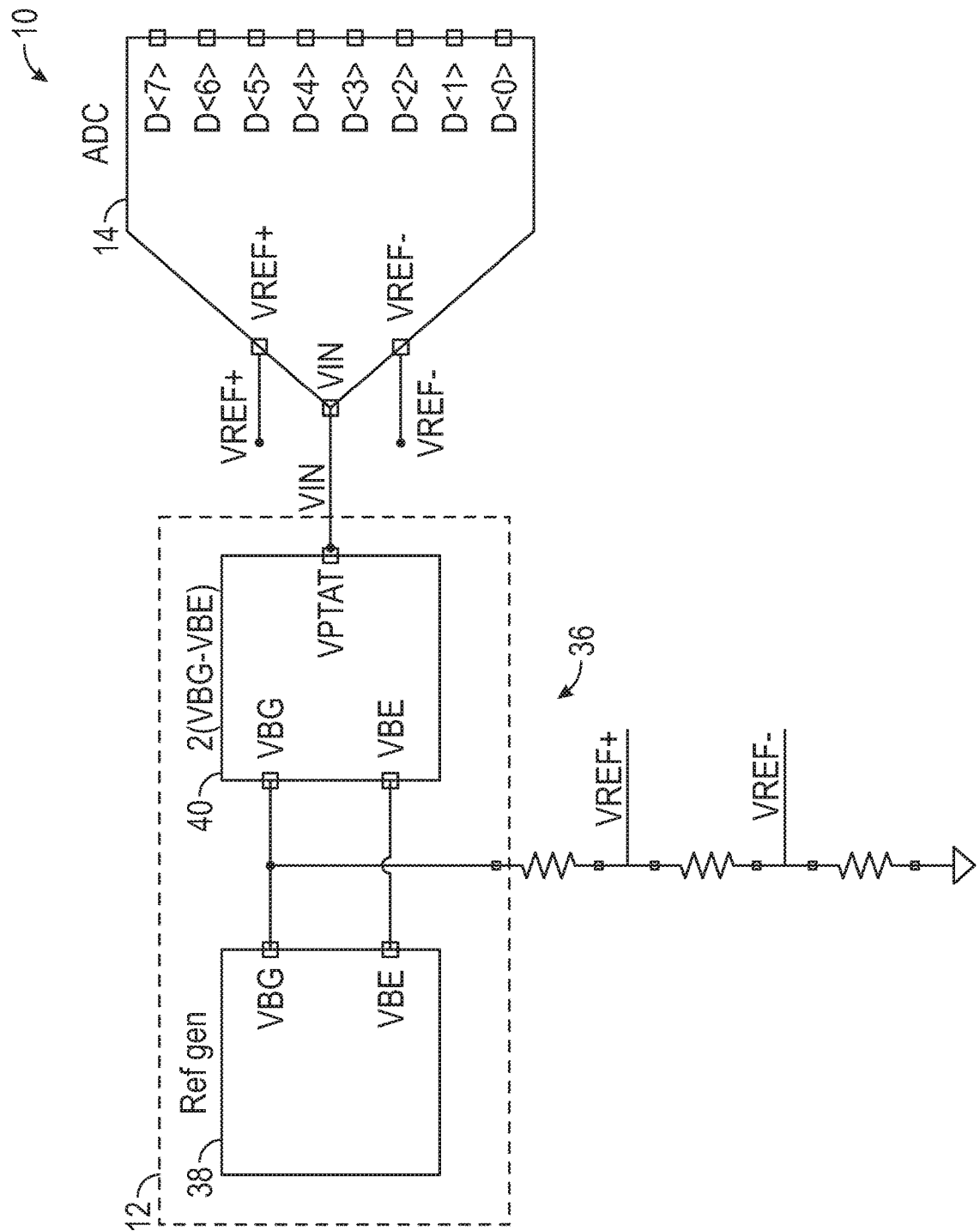
FIG. 4 is a schematic diagram of another exemplary temperature sensor, which includes a bandgap reference circuit having a first sub-circuit and a second sub-circuit.

FIG. 4 is a schematic diagram of another exemplary temperature sensor 10, which includes a bandgap reference circuit 12 having a first sub-circuit 38 and a second sub-circuit 40. The temperature sensor 10 of FIG. 4 may operate with a minimum reference voltage VDD_REF of about 2.1 V (using the first sub-circuit 38 of FIG. 5A) or a minimum reference voltage VDD_REF of about 1.5 V (using the first sub-circuit 38 of FIG. 5B).

Figure 5A:
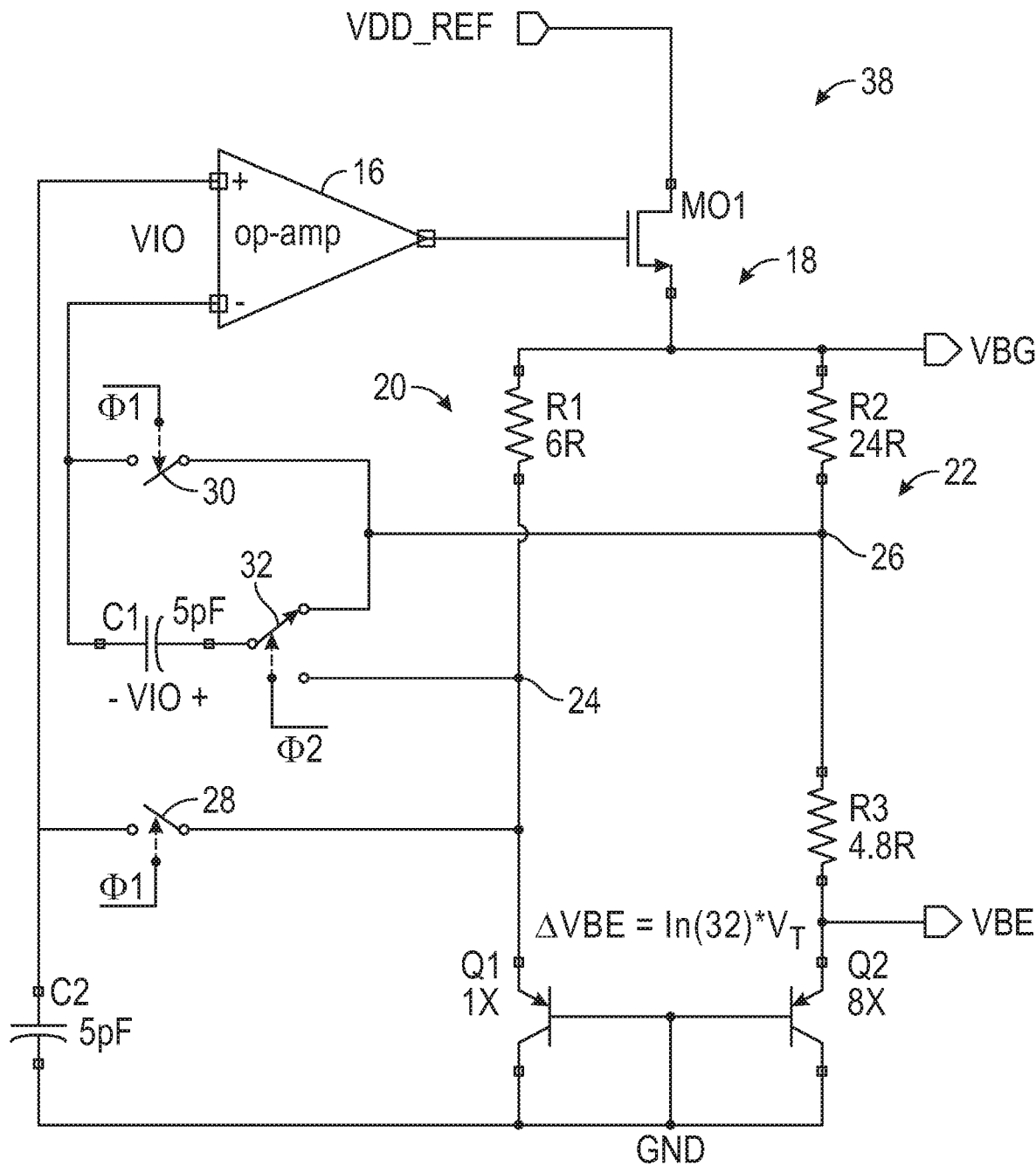
FIG. 5A is a schematic diagram of an exemplary first sub-circuit of the bandgap reference circuit of FIG. 4, illustrated in a hold mode.

FIG. 5A is a schematic diagram of an exemplary first sub-circuit 38 of the bandgap reference circuit 12 of FIG. 4, illustrated in a hold mode. The first sub-circuit 38 operates as described above with respect to FIGS. 2A and 2B. However, due to headroom constraints, the proportional resistor RP1 is removed. A base-emitter reference voltage VBE is defined at the emitter of the second semiconductor junction Q2 (e.g., between the third resistor R3 and the second semiconductor junction Q2). In the example depicted in FIG. 5A, the second capacitor C2 is coupled to the ground voltage GND to reduce noise, as described above with respect to FIG. 2C, though this is not required.

Figure 5B:
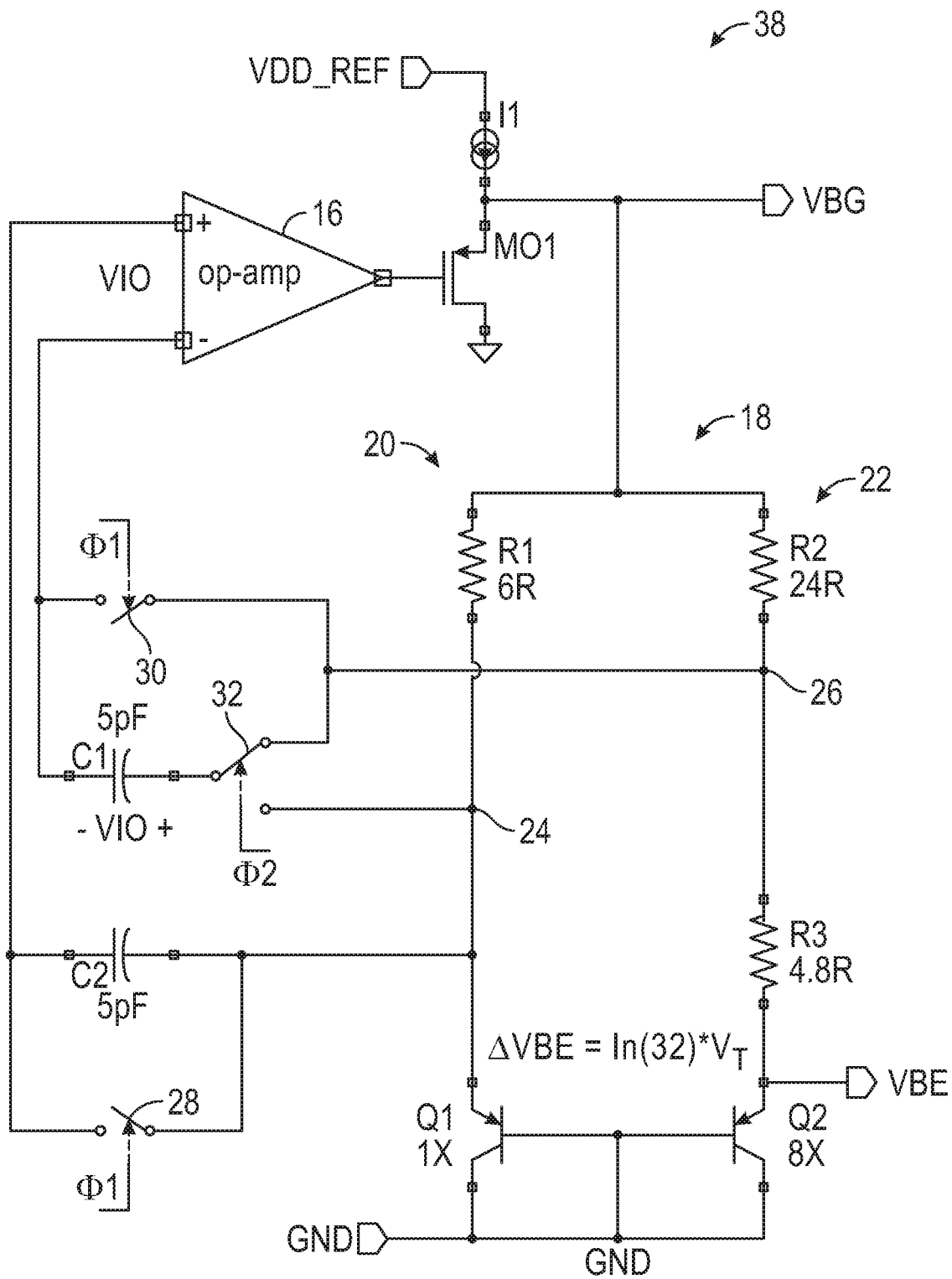
FIG. 5B is a schematic diagram of another exemplary first sub-circuit of the bandgap reference circuit of FIG. 4, illustrated in a hold mode.

FIG. 5B is a schematic diagram of another exemplary first sub-circuit 38 of the bandgap reference circuit 12 of FIG. 4, illustrated in a hold mode. The first sub-circuit 38 operates as described above with respect to FIGS. 2A and 2B. However, due to headroom constraints, the proportional resistor RP1 is replaced with a current source 11, and the output transistor MO1 is a PFET. Similar to the first sub-circuit 38 of FIG. 5A, the base-emitter reference voltage VBE is defined at the emitter of the second semiconductor junction Q2. In some examples, the second capacitor C2 can be coupled to the ground voltage GND to reduce noise, as described above with respect to FIG. 2C.

Figure 5C:
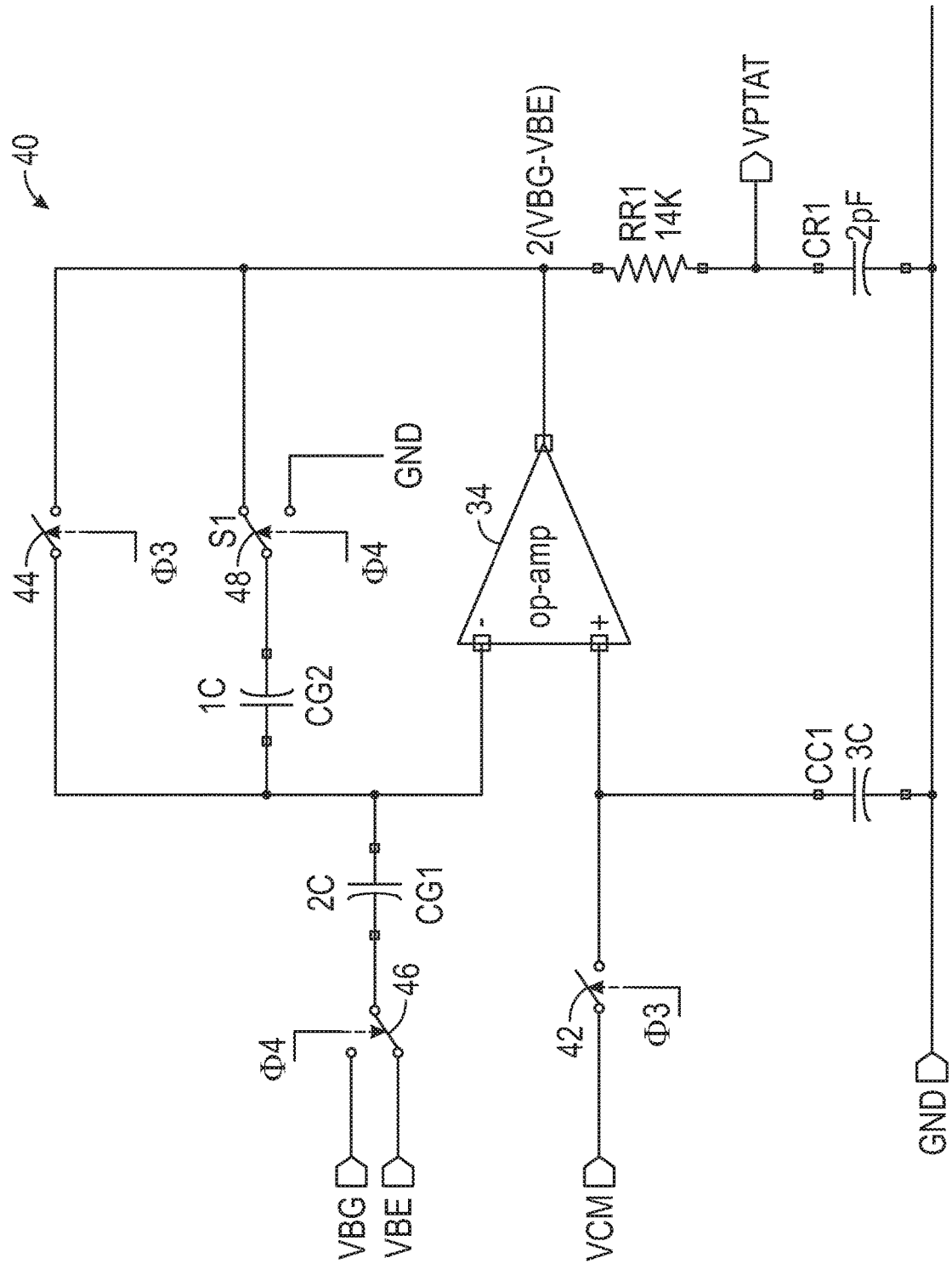
FIG. 5C is a schematic diagram of the second sub-circuit of the bandgap reference circuit of FIG. 4, illustrated in a hold mode.

FIG. 5C is a schematic diagram of the second sub-circuit 40 of the bandgap reference circuit 12 of FIG. 4, illustrated in a hold mode. The proportional to absolute temperature voltage VPTAT is created in the second sub-circuit 40 based on the bandgap reference voltage VBG and the base-emitter reference voltage VBE from the first sub-circuit 38. The second sub-circuit 40 samples a difference between the bandgap reference voltage VBG and the base-emitter reference voltage VBE, provides gain, and outputs a ground-referenced proportional to absolute temperature voltage VPTAT.

In this regard, the second sub-circuit 40 includes the second operational amplifier 34. The output of the second operational amplifier 34 is coupled to the positive input of the ADC 14 (see FIG. 4). The first reference resistor RR1 (with a 14 kΩ resistance) is coupled between the output of the second operational amplifier 34 and the positive input of the ADC 14, and a reference capacitor CR1 (with a 2 pF capacitance) is coupled between the positive input of the ADC 14 and the ground voltage GND. The reference resistor RR1 and the reference capacitor CR1 may operate as a low-pass filter which reduces high frequency noise on the proportional to absolute temperature voltage VPTAT output.

During the sample mode, the inverting input of the second operational amplifier 34 is coupled to the bandgap reference voltage VBG and to the output of the second operational amplifier 34. In addition, the non-inverting input of the second operational amplifier 34 is coupled to a common mode reference voltage VCM, which can be the base-emitter reference voltage VBE, the bandgap reference voltage VBG, or another convenient reference. However, using the base-emitter reference voltage VBE can advantageously reduce noise on the proportional to absolute temperature voltage VPTAT output.

As the bandgap reference circuit 12 was switched from the sample mode to the hold mode, the second sub-circuit 40 similarly uses a delayed non-overlapping third clock Φ3 and fourth clock Φ4. The bandgap reference circuit 12 must fully settle before these clocks transition. First, the third clock Φ3 goes low, opening a third SPST switch 42 and a fourth SPST switch 44. Next, the fourth clock Φ4 goes low, switching a second SPDT switch 46 to connect the inverting input of the second operational amplifier 34 to the base-emitter reference voltage VBE. The fourth clock Φ4 also switches a third SPDT switch 48, connecting the second gain capacitor CG2 between the output of the second operational amplifier 34 and the inverting input.

Gain is provided by the second sub-circuit 40 through a first gain capacitor CG1 and a second gain capacitor CG2. The first gain capacitor CG1 is coupled between the inverting input of the second operational amplifier 34 and the second SPDT switch 46. The second gain capacitor CG2 is coupled between the inverting input of the second operational amplifier 34 and the third SPDT switch 48. In the example depicted in FIG. 5B, the second sub-circuit 40 provides a gain of 2 through the ratio of the first gain capacitor CG1 (with capacitance of 2 times unit capacitance C) to the second gain capacitor CG2 (with unit capacitance C). In other examples, the gain may vary according to a desired output voltage from the second operational amplifier 34. In addition, during the hold mode the third SPST switch 42 opens, placing a charged capacitor CC1 (with capacitance 3 times unit capacitance C) between the non-inverting input of the second operational amplifier 34 and the ground voltage GND. This creates a pseudo-differential configuration whereby equal leakage in the SPST switches 42 and 44 will only shift the common mode reference voltage VCM; the proportional to absolute temperature voltage VPTAT will be unaffected.

Figure 6:
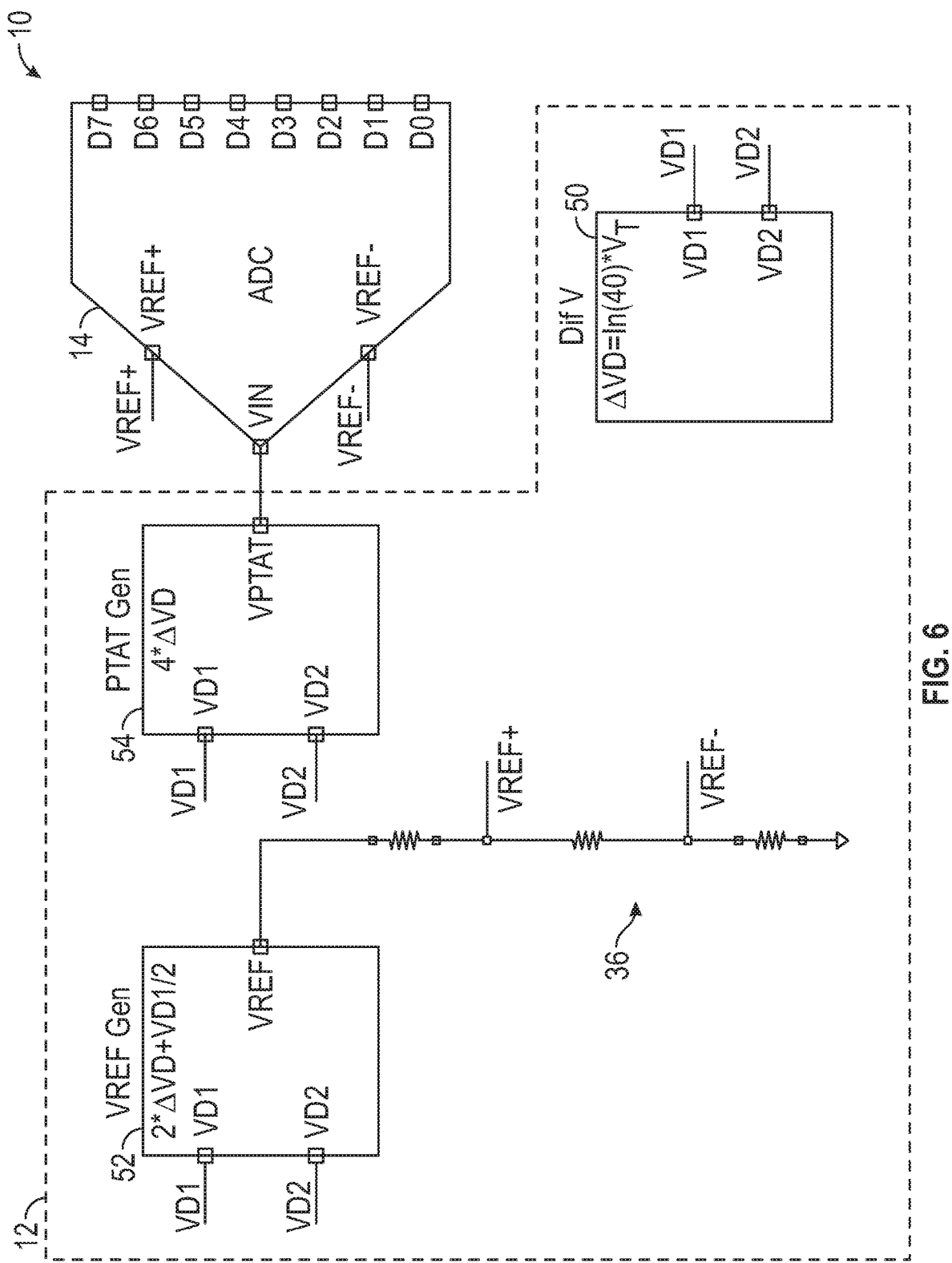
FIG. 6 is a schematic diagram of another exemplary temperature sensor, which includes a bandgap reference circuit having a differential voltage sub-circuit, a reference voltage generator sub-circuit, and a proportional to absolute temperature voltage generator sub-circuit.

FIG. 6 is a schematic diagram of another exemplary temperature sensor 10, which includes a bandgap reference circuit 12 having a differential voltage sub-circuit 50, a reference voltage generator sub-circuit 52, and a PTAT generator sub-circuit 54. The temperature sensor 10 of FIG. 6 may operate with a minimum reference voltage VDD_REF of 1.08 V.

Figure 7A:
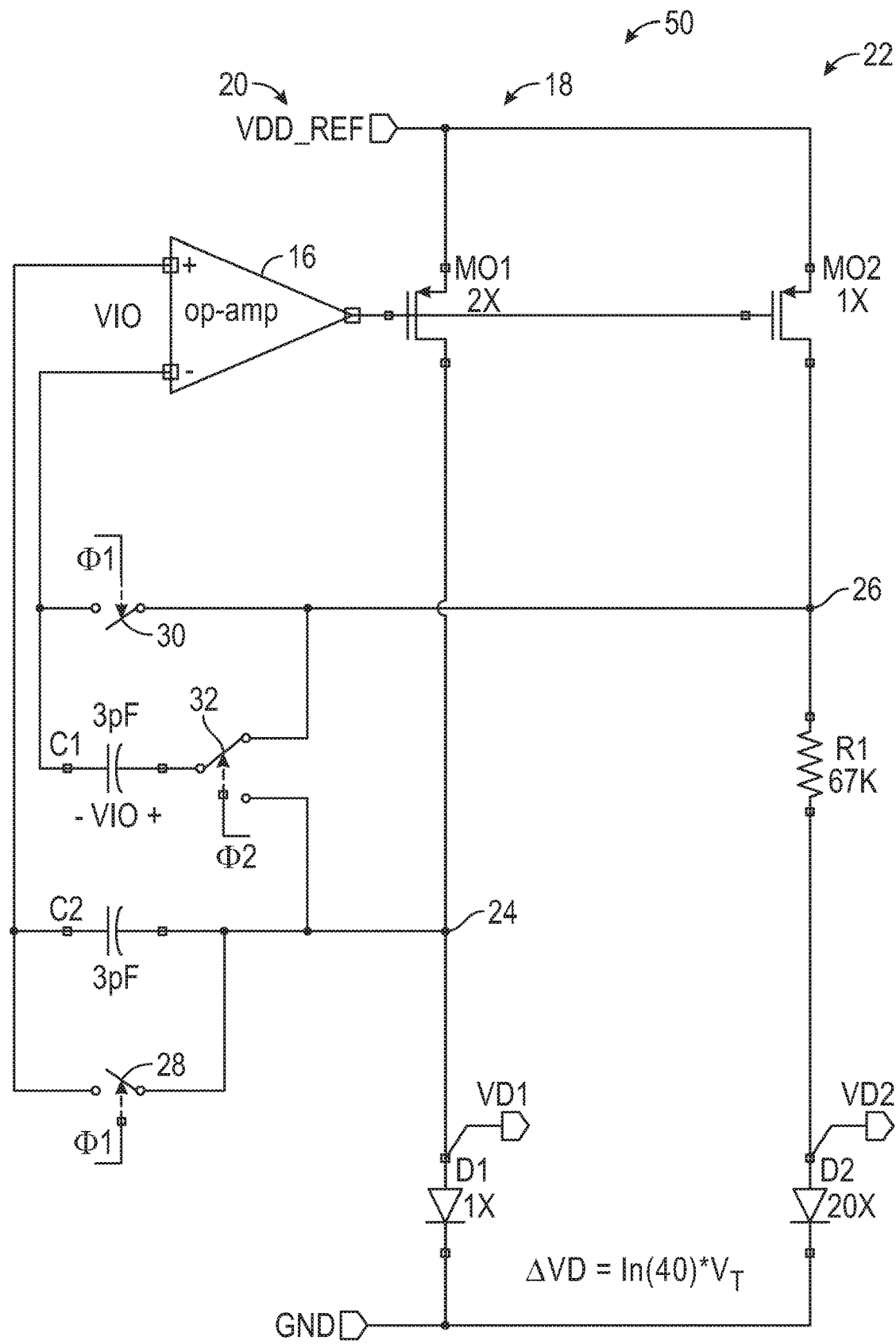
FIG. 7A is a schematic diagram of the differential voltage sub-circuit of the bandgap reference circuit of FIG. 6, illustrated in a hold mode.

FIG. 7A is a schematic diagram of the differential voltage sub-circuit 50 of the bandgap reference circuit 12 of FIG. 6, illustrated in a hold mode. The differential voltage sub-circuit 50 operates as described above with respect to FIGS. 2A and 2B. However, with the minimum reference voltage VDD_REF of 1.08 V, the bandgap reference circuit 12 cannot operate with a 1.2 V bandgap reference voltage VBG. Instead, the differential voltage sub-circuit 50 creates a differential PTAT voltage ΔVD, defined by the difference between a first differential voltage VD1 and a second differential voltage VD2. The differential voltage sub-circuit 50 is thus able to operate with the reference voltage VDD_REF as low as 1.08 V.

The differential voltage sub-circuit 50 operates in a manner similar to the bandgap reference circuit 12 described above with respect to FIGS. 2A and 2B while outputting the first differential voltage VD1 and the second differential voltage VD2. In this regard, the differential voltage sub-circuit 50 includes a first output transistor MO1 and a second output transistor MO2 coupled between the reference voltage VDD_REF and the ground voltage GND. The output of the first operational amplifier 16 is coupled (e.g., directly coupled) to a gate of the first output transistor MO1 and to a gate of the second output transistor MO2. In some examples, the second capacitor C2 can be coupled to the ground voltage GND to reduce noise, as described above with respect to FIG. 2C.

The inputs of the first operational amplifier 16 are coupled to the voltage divider network 18. The first branch 20 of the voltage divider network 18 is coupled between the reference voltage VDD_REF and the ground voltage GND, and includes the first output transistor MO1 (e.g., a PFET with a 2:1 width ratio versus the second output transistor MO2) coupled in series with the first semiconductor junction (e.g., a first diode D1). The second branch 22 is coupled in parallel with the first branch 20 and includes the second output transistor MO2 (e.g., a PFET), the third resistor R3 (with a 67 kΩ resistance), and the second semiconductor junction (e.g., a second diode D2 with a 20:1 P-N junction area ratio versus the first diode D1) coupled in series. The first node 24 is between the first output transistor MO1 and the first semiconductor junction (e.g., the first diode D1) and the second node 26 is between the second output transistor MO2 and the third resistor R3.

Similar to the bandgap reference circuit 12 described above with respect to FIGS. 2A and 2B, the differential voltage sub-circuit 50 operates to measure the temperature dependent forward voltage of the first semiconductor junction (e.g., the first diode D1) and the second semiconductor junction (e.g., the second diode D2) using a current difference between the first branch 20 and the second branch 22, along with the area difference between the first diode D1 and the second diode D2. In addition, the first capacitor C1 corrects for the offset of the first operational amplifier 16 during the hold mode. The differential voltage sub-circuit 50 outputs the first differential voltage VD1 at the first node 24 (e.g., between the first output transistor MO1 and the first diode D1) and outputs the second differential voltage VD2 at a node between the third resistor R3 and the second diode D2.

Figure 7B:
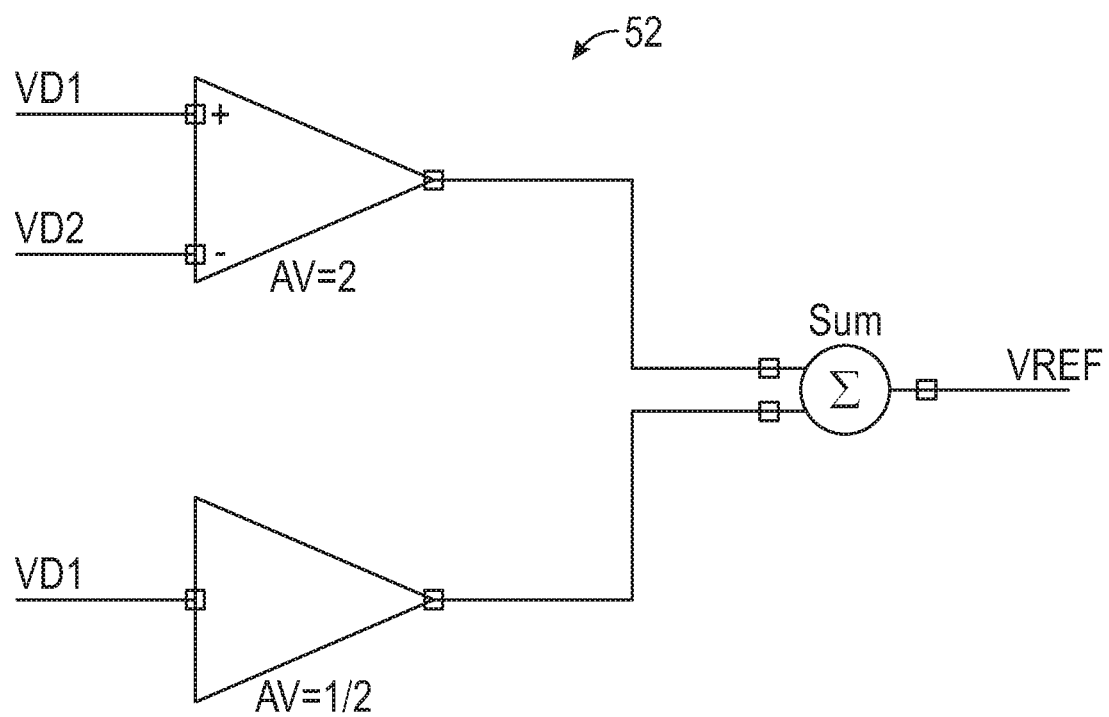
FIG. 7B is a functional diagram of the reference voltage generator sub-circuit of the bandgap reference circuit of FIG. 6.

FIG. 7B is a functional diagram of the reference voltage generator sub-circuit 52 of the bandgap reference circuit 12 of FIG. 6. In this regard, the reference voltage generator sub-circuit 52 derives a temperature independent reference voltage VREF (e.g., the bandgap reference voltage) from the first differential voltage VD1 and the second differential voltage VD2, by setting $$VREF = 2(VD1 - VD2) + \frac{VD1}{2}.$$

Figure 7C:
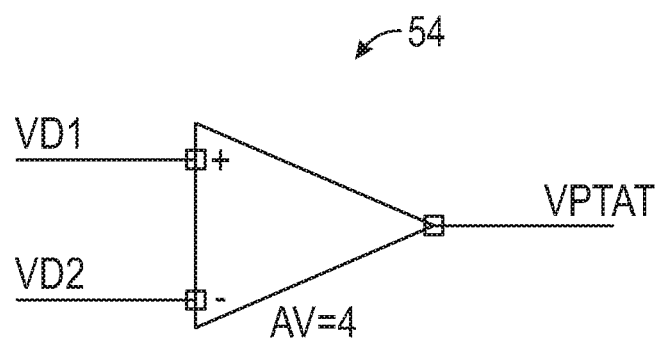
FIG. 7C is a functional diagram of the proportional to absolute temperature voltage generator sub-circuit of the bandgap reference circuit of FIG. 6.

FIG. 7C is a functional diagram of the PTAT generator sub-circuit 54 of the bandgap reference circuit 12 of FIG. 6. In this regard, the PTAT generator sub-circuit 54 derives the proportional to absolute temperature voltage VPTAT from the first differential voltage VD1 and the second differential voltage VD2. The PTAT generator sub-circuit 54 functions similar to the second sub-circuit 40 of FIG. 4 (and FIG. 5C), with a gain of 4 rather than 2.

It should be understood that the capacitor ratios of the differential voltage sub-circuit 50 and the gains of the reference voltage generator sub-circuit 52 and the PTAT generator sub-circuit 54 of FIGS. 6-7C are exemplary in nature and can be adjusted as needed. The exemplary ratios were chosen to facilitate a common-centroid layout for the capacitor arrays in the temperature sensor 10 of FIG. 6.

Figure 8:
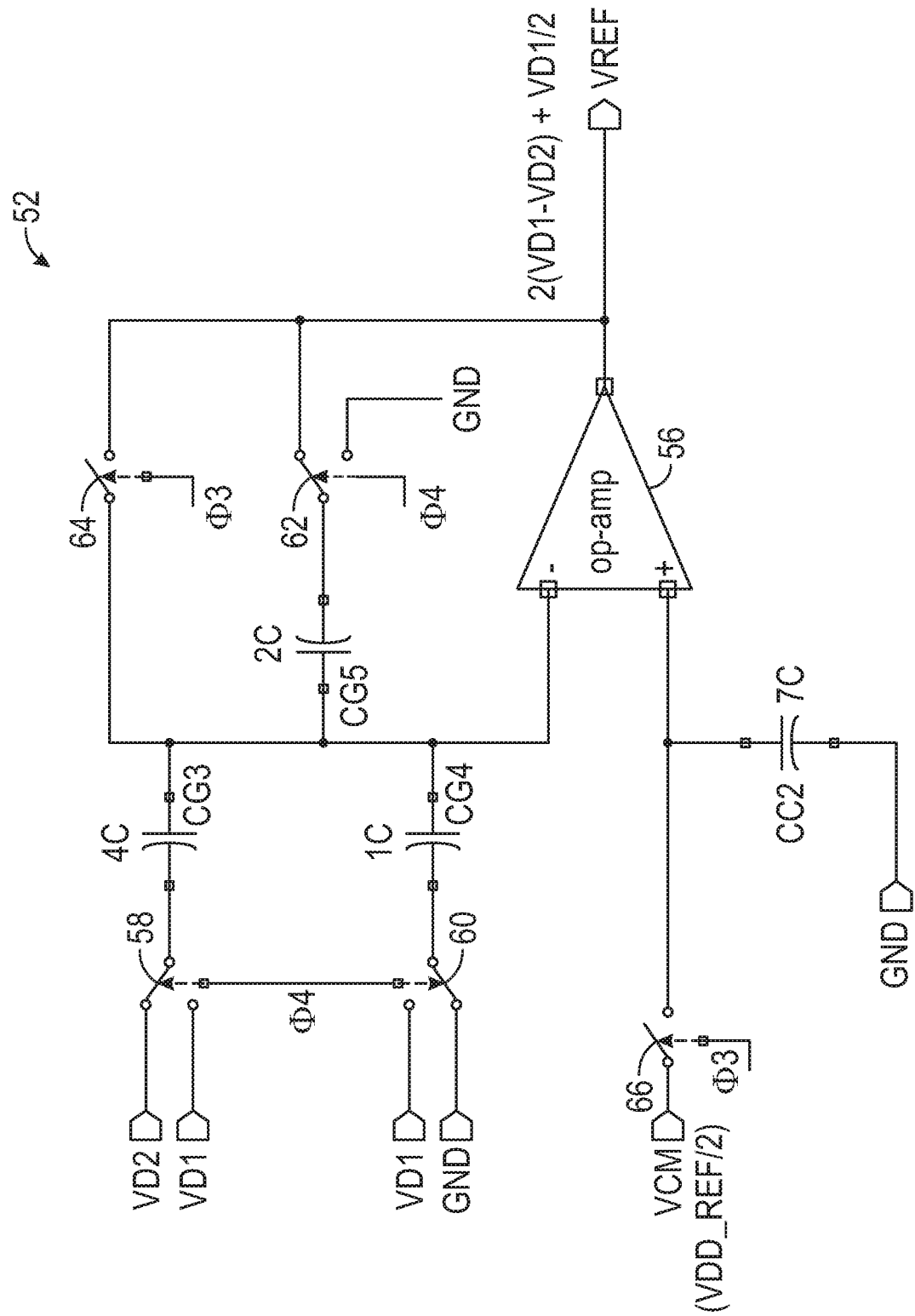
FIG. 8 is a schematic diagram of the reference voltage generator sub-circuit of FIG. 7B, illustrated in a hold mode.

In greater detail, FIG. 8 is a schematic diagram of the reference voltage generator sub-circuit 52 of FIG. 7B, illustrated in a hold mode. The reference voltage generator sub-circuit 52 produces the temperature independent reference voltage VREF as an output of a third operational amplifier 56 using the first differential voltage VD1, the second differential voltage VD2, and the common mode voltage VCM (in this example, equal to one half the reference voltage VDD_REF). In this manner, the reference voltage generator sub-circuit 52 samples the first differential voltage VD1 and the second differential voltage VD2, providing an output voltage according to the following equation:

$$VREF = 2(VD1 - VD2) + \frac{VD1}{2}.$$

During the sample mode, an inverting input of the third operational amplifier 56 is coupled to the first differential voltage VD1 (via a fourth SPDT switch 58 and a fifth SPDT switch 60), coupled to the ground voltage GND (via a sixth SPDT switch 62), and to the output of the third operational amplifier 56 (via a fifth SPST switch 64). In addition, a non-inverting input of the third operational amplifier 56 is coupled to the common mode voltage VCM (via a sixth SPST switch 66) and to the ground voltage GND (via a second charge capacitor CC2 with capacitance of 7 times unit capacitance C).

When switching from the sample mode to the hold mode, the reference voltage generator sub-circuit 52 uses the non-overlapping third clock Φ3 and fourth clock Φ4. First, the third clock Φ3 goes low, opening the fifth SPST switch 64 and the sixth SPST switch 66. Next, the fourth clock Φ4 goes low, switching the fourth SPDT switch 58 and the fifth SPDT switch 60 to connect the inverting input of the third operational amplifier 56 to the second differential voltage VD2. The fourth clock Φ4 also switches the sixth SPDT switch 62.

Gain is provided by the reference voltage generator sub-circuit 52 through a third gain capacitor CG3, a fourth gain capacitor CG4, and a fifth gain capacitor CG5. The third gain capacitor CG3 (with capacitance of 4 times unit capacitance C) is coupled between the inverting input of the third operational amplifier 56 and the fourth SPDT switch 58. The fourth gain capacitor CG4 (with unit capacitance C) is coupled between the inverting input of the third operational amplifier 56 and the fifth SPDT switch 60. The fifth gain capacitor CG5 (with capacitance of 2 times unit capacitance C) is coupled between the inverting input of the third operational amplifier 56 and the sixth SPDT switch 62.

Figure 9:
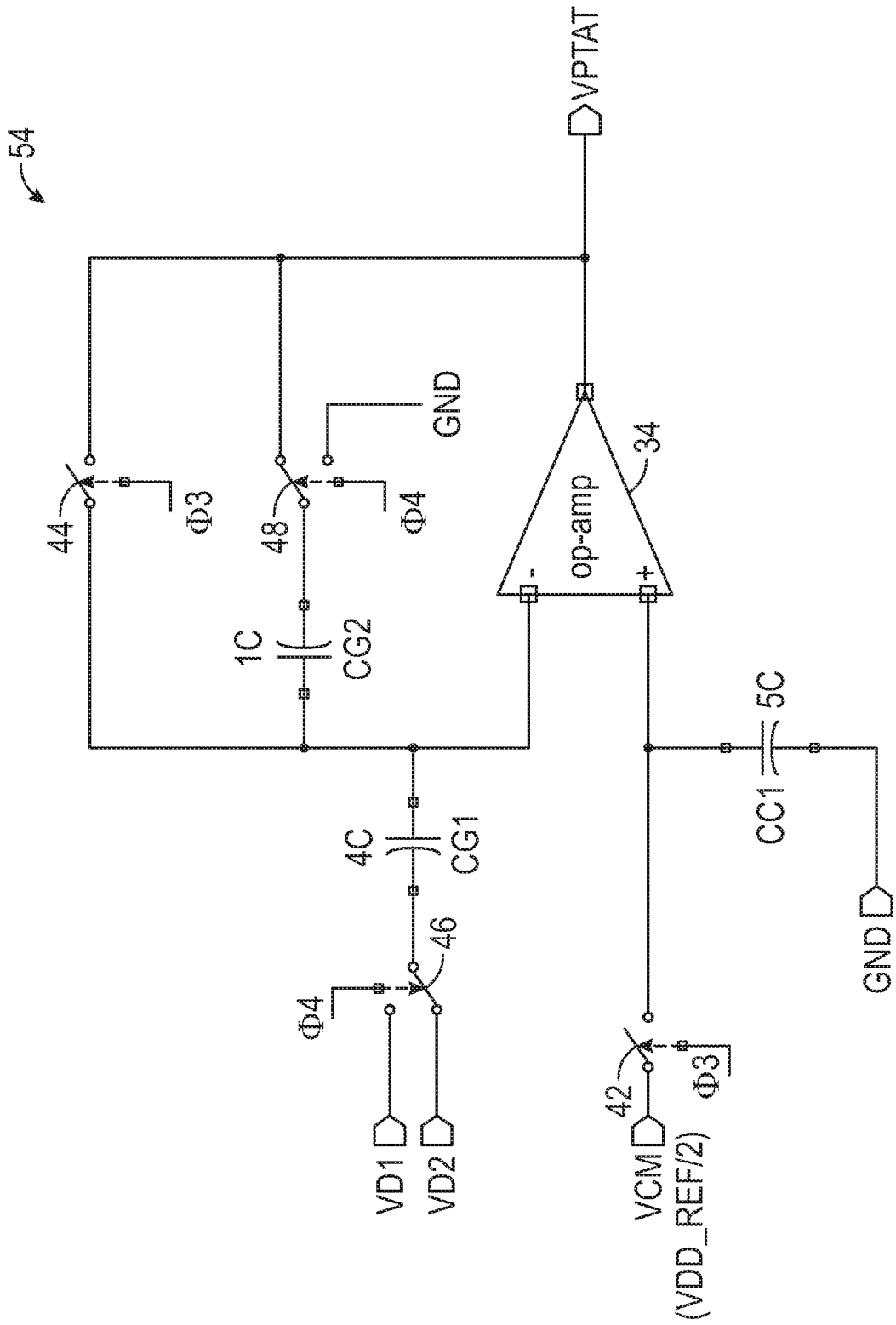
FIG. 9 is a schematic diagram of the proportional to absolute temperature voltage generator sub-circuit of FIG. 7C, illustrated in a hold mode.

FIG. 9 is a schematic diagram of the PTAT generator sub-circuit 54 of FIG. 7C, illustrated in a hold mode. As described above, the PTAT generator sub-circuit 54 functions similar to the second sub-circuit 40 of FIG. 4 (and FIG. 5C), with a gain of 4 provided by the first gain capacitor CG1 (with capacitance of 4 times unit capacitance C) and the second gain capacitor CG2 (with unit capacitance C). The PTAT generator sub-circuit 54 samples a difference between the first differential voltage VD1 and the second differential voltage VD2, provides gain, and outputs the proportional to absolute temperature voltage VPTAT. Thus, the second SPDT switch 46 switches the inverting input of the second operational amplifier 34 between the first differential voltage VD1 and the second differential voltage VD2. The third SPST switch 42 switches the non-inverting input of the second operational amplifier 34 between the common mode voltage VCM and the charged capacitor CC1 (with capacitance 5 times unit capacitance C).

Returning to FIG. 6, the ADC 14 is configured to convert the proportional to absolute temperature voltage VPTAT from analog to digital using the temperature independent reference voltage VREF divided into the positive differential input VREF+ and the negative differential input VREF−. In this regard, an input of the ADC 14 is coupled to the output of the second operational amplifier 34 (e.g., the proportional to absolute temperature voltage VPTAT). The resistor ladder 36 provides the positive differential input VREF+ and the negative differential input VREF− as the second input for the ADC 14, while the proportional to absolute temperature voltage VPTAT provides the temperature-dependent input voltage. The values of the positive differential input VREF+ and the negative differential input VREF− are set at the upper and lower limits of the proportional to absolute temperature voltage VPTAT respectively.

Those skilled in the art will recognize improvements and modifications to the preferred embodiments of the present disclosure. All such improvements and modifications are considered within the scope of the concepts disclosed herein and the claims that follow.

What is claimed is:

1. A temperature sensor, comprising:
an analog-to-digital converter (ADC) having a first input coupled to a proportional to absolute temperature voltage and a second input coupled to a bandgap reference voltage, wherein the ADC is configured to output a digital temperature signal;
a bandgap reference circuit comprising:
an output transistor coupled between a reference voltage and the bandgap reference voltage;
a first operational amplifier having an output coupled to a gate of the output transistor; and
a first capacitor coupled to a first input of the first operational amplifier, wherein during a hold mode the first capacitor corrects the bandgap reference voltage for an offset of the first operational amplifier;
a reference transistor coupled between the second input of the ADC and a ground voltage; and
a second operational amplifier having an output coupled to a gate of the reference transistor and a non-inverting input coupled to the bandgap reference voltage.

2. The temperature sensor of claim 1, wherein:
the bandgap reference circuit further comprises a second capacitor matched to the first capacitor; and
during a sample mode the first capacitor is coupled in parallel with an operational amplifier input voltage of the first operational amplifier.

3. The temperature sensor of claim 2, wherein during the sample mode the second capacitor is bypassed.

4. The temperature sensor of claim 3, wherein the bandgap reference circuit further comprises a voltage divider network coupled between the bandgap reference voltage and the ground voltage, the voltage divider network comprising:
a first branch comprising a first resistor and a first semiconductor junction; and
a second branch parallel to the first branch and comprising a second resistor, a third resistor, and a second semiconductor junction.

5. The temperature sensor of claim 4, wherein during the hold mode the second capacitor is coupled between a non-inverting input of the first operational amplifier and a first node between the first resistor and the first semiconductor junction.

6. The temperature sensor of claim 5, wherein during the hold mode the first capacitor is coupled between an inverting input of the first operational amplifier and a second node between the second resistor and the third resistor.

7. A temperature sensor, comprising:
an analog-to-digital converter (ADC) having a voltage input coupled to a proportional to absolute temperature voltage, a positive differential input, and a negative differential input, wherein the ADC is configured to output a digital temperature signal;
a resistor ladder coupled between a bandgap reference voltage, the positive differential input of the ADC, and the negative differential input of the ADC; and
a bandgap reference circuit comprising:
an output transistor coupled between a reference voltage and the bandgap reference voltage;
a first operational amplifier having an output coupled to a gate of the output transistor; and
a first capacitor coupled to a first input of the first operational amplifier, wherein during a hold mode the first capacitor corrects the bandgap reference voltage for an offset of the first operational amplifier.

8. The temperature sensor of claim 7, further comprising:
a reference transistor coupled between the voltage input of the ADC and the reference voltage; and
a second operational amplifier having an output coupled to a gate of the reference transistor and a non-inverting input coupled to the proportional to absolute temperature voltage.

9. The temperature sensor of claim 7, wherein:
the bandgap reference circuit further comprises a second operational amplifier having an output coupled to the voltage input of the ADC; and
during a sample mode:
an inverting input of the second operational amplifier is coupled to the bandgap reference voltage; and
a non-inverting input of the second operational amplifier is coupled to a common mode voltage.

10. The temperature sensor of claim 9, wherein during the hold mode a charging capacitor is coupled between the non-inverting input of the second operational amplifier and a ground voltage.

11. The temperature sensor of claim 7, wherein:
the output transistor is a first output transistor;
the output of the first operational amplifier is further coupled to a gate of a second output transistor; and
the proportional to absolute temperature voltage and the bandgap reference voltage are derived from a first differential voltage coupled to the first output transistor and a second differential voltage coupled to the second output transistor.

12. The temperature sensor of claim 11, wherein the bandgap reference circuit further comprises a voltage divider network coupled between the reference voltage and a ground voltage, the voltage divider network comprising:
a first branch comprising the first output transistor and a first semiconductor junction; and
a second branch parallel to the first branch and comprising a first resistor and a second semiconductor junction.

13. The temperature sensor of claim 12, wherein during the hold mode:
a second capacitor is coupled between a non-inverting input of the first operational amplifier and the first output transistor; and
the first capacitor is coupled between an inverting input of the first operational amplifier and a second node between the second output transistor and the first resistor.

14. The temperature sensor of claim 11, wherein:
an input of the ADC is coupled to an output of a second operational amplifier; and
during the hold mode an inverting input of the second operational amplifier is coupled to the output of the second operational amplifier and the second differential voltage.

15. A temperature sensor, comprising:
an analog-to-digital converter (ADC) configured to output a digital temperature signal from a proportional to absolute temperature voltage and a bandgap reference voltage, wherein the proportional to absolute temperature voltage and the bandgap reference voltage are derived from a first differential voltage and a second differential voltage;
a bandgap reference circuit comprising:
a first output transistor coupled to the first differential voltage and coupled between a reference voltage and the bandgap reference voltage;
a second output transistor coupled to the second differential voltage;

a first operational amplifier having an output coupled to a gate of the first output transistor and a gate of the second output transistor; and a first capacitor coupled to a first input of the first operational amplifier, wherein during a hold mode the first capacitor corrects the bandgap reference voltage for an offset of the first operational amplifier; and a second operational amplifier having an output coupled to an input of the ADC, wherein during the hold mode an inverting input of the second operational amplifier is coupled to the output of the second operational amplifier and the second differential voltage.

16. The temperature sensor of claim 15, wherein:
the bandgap reference circuit further comprises a second capacitor matched to the first capacitor;
during a sample mode the first capacitor is coupled in parallel with an operational amplifier input voltage of the first operational amplifier; and
during the sample mode the second capacitor is bypassed.

17. The temperature sensor of claim 16, wherein the bandgap reference circuit further comprises a voltage divider network coupled between the bandgap reference voltage and a ground voltage, the voltage divider network comprising:
a first branch comprising a first resistor and a first semiconductor junction; and
a second branch parallel to the first branch and comprising a second resistor, a third resistor, and a second semiconductor junction.

18. The temperature sensor of claim 17, wherein:
during the hold mode the second capacitor is coupled between a non-inverting input of the first operational amplifier and a first node between the first resistor and the first semiconductor junction; and
during the hold mode the first capacitor is coupled between an inverting input of the first operational amplifier and a second node between the second resistor and the third resistor.

19. The temperature sensor of claim 15, wherein the bandgap reference circuit further comprises a voltage divider network coupled between the reference voltage and a ground voltage, the voltage divider network comprising:
a first branch comprising the first output transistor and a first semiconductor junction; and
a second branch parallel to the first branch and comprising a first resistor and a second semiconductor junction.

20. The temperature sensor of claim 19, wherein during the hold mode:
a second capacitor is coupled between a non-inverting input of the first operational amplifier and the first output transistor; and
the first capacitor is coupled between an inverting input of the first operational amplifier and a second node between the second output transistor and the first resistor.

* * * * *